United States Patent [19]

Kato et al.

[11] Patent Number: 5,146,313
[45] Date of Patent: Sep. 8, 1992

[54] METALLIZED CERAMIC STRUCTURE COMPRISING ALUMINUM NITRIDE AND TUNGSTEN LAYERS

[75] Inventors: Takeyuki Kato, Aichi; Yasunobu Yoneda; Yukio Sakabe, both of Kyoto, all of Japan

[73] Assignee: Murata Manufacturing Co., Ltd., Japan

[21] Appl. No.: 395,343

[22] Filed: Aug. 17, 1989

[30] Foreign Application Priority Data

Aug. 18, 1988 [JP] Japan .................. 63-204954

[51] Int. Cl.$^5$ .................. H01L 23/15; H05B 3/12; B32B 15/04
[52] U.S. Cl. .................. 357/74; 357/67; 357/71; 428/610; 428/620; 428/627; 428/665; 219/553
[58] Field of Search .................. 428/610, 620, 623, 627, 428/665; 357/67, 71, 74, 80; 219/553

[56] References Cited

U.S. PATENT DOCUMENTS

| | | | |
|---|---|---|---|
| 3,692,576 | 9/1972 | Takayanagi et al. | 428/610 |
| 3,767,447 | 10/1973 | Mizuno et al. | 428/610 |
| 4,481,237 | 11/1984 | Bosshart et al. | 428/610 |
| 4,503,130 | 3/1985 | Bosshart | 428/610 |
| 4,695,517 | 9/1987 | Okuno et al. | 428/689 |
| 4,743,511 | 5/1988 | Sowman et al. | 428/610 |
| 4,778,649 | 10/1988 | Niino et al. | 428/610 |
| 4,800,137 | 1/1989 | Okuno et al. | 501/96 |
| 4,911,625 | 3/1990 | Begg et al. | 428/610 |
| 5,060,049 | 10/1991 | Yamasaki et al. | 357/67 |

FOREIGN PATENT DOCUMENTS 61-281089 12/1986 Japan .

*Primary Examiner*—George Wyszomierski
*Attorney, Agent, or Firm*—Ostrolenk, Faber, Gerb & Soffen

[57] ABSTRACT

A metallized ceramic structure includes a ceramic substrate preferably aluminum nitride and a metallic layer preferably tungsten bonded to the ceramic substrate. First and second mixture layers are formed between the ceramic substrate and the metallic layer to bond the ceramic substrate and the metallic layer. The first mixture layer is in contact with the ceramic substrate and the second mixture layer is in contact with the metallic layer. Each of the mixture layers includes a mixture of ceramic of the ceramic substrate and the metal of the metallic layer. The second mixture layer has a lower percentage of the ceramic than the first mixture layer.

15 Claims, 3 Drawing Sheets

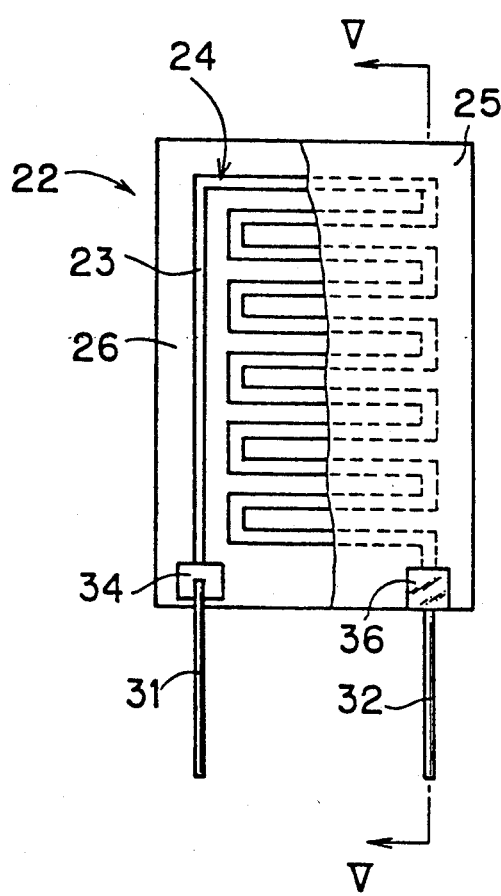
FIG. 4
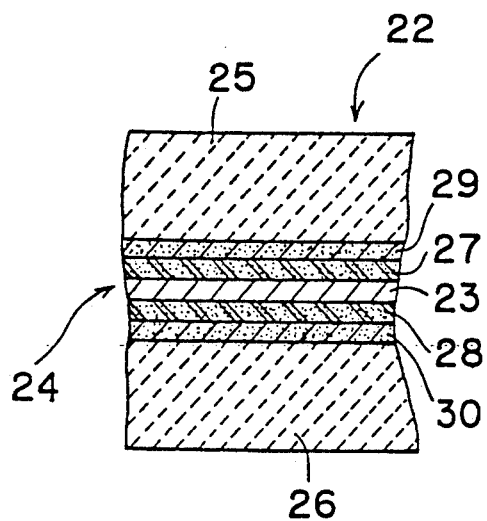
FIG. 6
FIG. 7
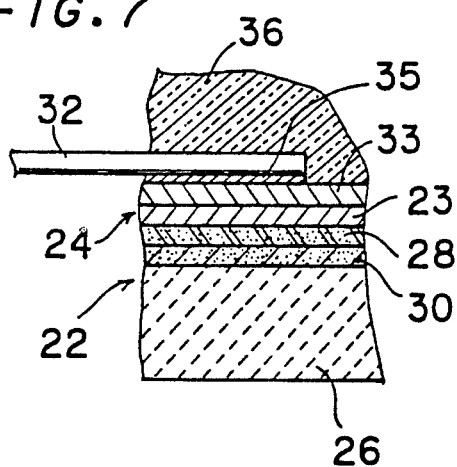
FIG. 5
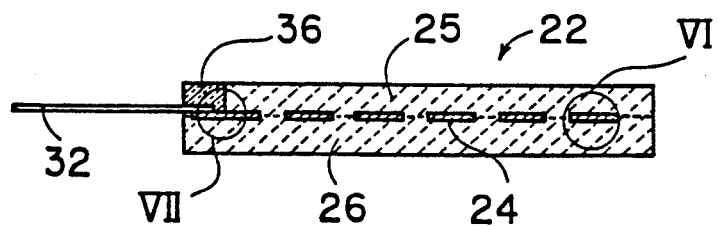

METALLIZED CERAMIC STRUCTURE COMPRISING ALUMINUM NITRIDE AND TUNGSTEN LAYERS

BACKGROUND OF THE INVENTION

1. Field of the Invention

The present invention relates to a structure metallized with tungsten (W) which is formed on an aluminum nitride (AlN) substrate, and more particularly, relates to an improvement for increasing the junction strength of a W layer with respect to an AlN substrate.

2. Description of the Background Art

AlN is an electrical insulating material which has high heat conductivity, i.e., heat dissipation capacity. Therefore, a substrate of such AlN is advantageously applied to electrical equipment which requires heat dissipation.

In order to form a metallized structure on such an AlN substrate for providing a conductive path, a metal for example, tungsten is employed as the metallizing metal in consideration of heat resistance.

However, since AlN is inferior in wettability with tungsten, a tungsten layer formed on the AlN substrate is reduced in junction strength with respect to the AlN substrate. Further, when the AlN substrate is subjected to a heating step and a following cooling step, the tungsten layer is at least partially separated or the AlN substrate is partially damaged due to differences in the thermal expansion coefficient between AlN and tungsten. This further prompts the aforementioned reduction in junction strength.

In order to solve such problems, Japanese Patent Laying-Open No. 281089/1986 has proposed a technique of interposing a layer of a mixture of AlN and tungsten between an AlN substrate and a tungsten layer. Such an intermediate layer of the mixture is adapted to improve the junction strength between the AlN substrate and the tungsten layer.

However, it has been clarified through experiments made by the inventors that the junction strength with respect to the AlN substrate is gradually reduced particularly by repetition of heating and cooling steps in the aforementioned metallized structure.

SUMMARY OF THE INVENTION

Accordingly, an object of the present invention is to provide a structure metallized with tungsten, which has high junction strength with respect to an aluminum nitride substrate. This provides a highly reliable juncture between the tungsten layer and the aluminum nitride substrate.

Another object of the present invention is to provide a structure metallized with tungsten, whose junction strength with respect to an aluminum nitride substrate is hardly reduced upon repetition of heating and cooling steps.

The present invention is characterized in that at least two mixture layers are formed in a stratified manner between an aluminum nitride substrate and a tungsten layer of tungsten. Such at least two mixture layers contain a mixture of tungsten and the same ceramic component as that contained in the aluminum nitride substrate. These at least two mixture layers include first and second mixture layers, such that the first mixture layer is in contact with the aluminum nitride substrate and the second mixture layer is in contact with the tungsten layer. The first mixture layer has a larger content of the ceramic component than the second mixture layer.

According to a preferred embodiment of the present invention, an electrolytic plating layer of nickel, for example, is formed on the tungsten layer, and a conductive member such as a terminal member, for example, is brazed to the electrolytic plating layer.

According to another preferred embodiment of the present invention, the aforementioned mixture layers and the tungsten layer are formed in relation to each major surface of the aluminum nitride substrate.

According to still another embodiment of the present invention, a group including at least two mixture layers and the aluminum nitride substrate is provided on each side of the tungsten layer.

According to the present invention, two or more mixture layers commonly containing the components contained in the aluminum nitride substrate and the tungsten layer are formed in a stratified manner between the aluminum nitride substrate and the tungsten layer. Within the mixture layers, the first mixture layer which is in contact with the aluminum nitride substrate is closer in component to the aluminum nitride substrate while the second mixture layer which is in contact with the tungsten layer is closer in component to the tungsten layer. Therefore, the component difference between the respective adjacent elements from the aluminum nitride substrate to the tungsten layer can be further reduced as compared with the structure provided with only a single mixture layer between the aluminum substrate and the tungsten layer. Thus, the junction strength between the respective elements from the aluminum nitride substrate to the tungsten layer can be further improved. Further, it is possible to prevent reduction of such junction strength caused by repeated heating and cooling steps.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a front elevational view showing a ceramic heater to which the present invention is applied;

FIG. 5 is a sectional view taken along the line V—V in FIG. 4;

FIG. 6 is an enlarged sectional view showing a part VI of FIG. 5;

FIG. 7 is an enlarged sectional view showing a part VII of FIG. 5;

DESCRIPTION OF THE PREFERRED EMBODIMENTS

Figure 1:
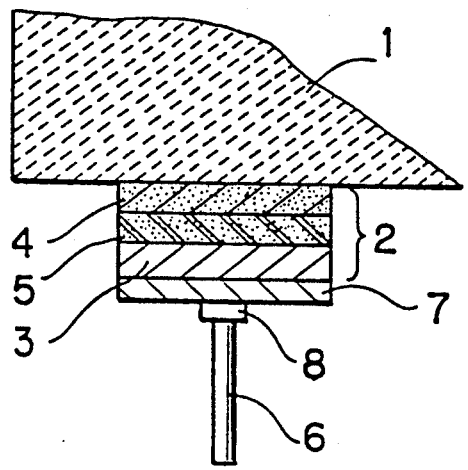
FIG. 1 is an enlarged sectional view showing an embodiment of the present invention.

Referring to FIG. 1, a metallized laminate 2 is formed on an AlN substrate 1. The metallized laminate 2 comprises a tungsten layer 3 of tungsten and two mixture layers 4 and 5 which are formed between the AlN substrate 1 and the tungsten layer 3 in a stratified manner. The mixture layers 4 and 5 contain a mixture of tungsten and the same ceramic component as that contained in the AlN substrate 1. The first mixture layer 4 which is in contact with the AlN substrate 1 has a larger content of the ceramic component as compared with the second mixture layer 5 which is in contact with the tungsten layer 3.

The tungsten layer 3 provides a conductive path. In order to connect a terminal pin 6 to such a tungsten layer 3, an electrolytic plating layer 7 of nickel, for example, is formed in the connecting portion. The terminal pin 6 is brazed to the electrolytic plating layer 7 by a brazing filler metal 8. The brazing filler metal 8 can be prepared from silver solder or lead-tin alloy.

A method of fabricating the AlN substrate 1 having the aforementioned metallized laminate 2 is now described.

First, an AlN green sheet, to which 3 percent by weight of $Y_2O_3$, for example, is added as a sintering agent, is prepared for the AlN substrate 1. Then, paste materials are prepared from two types of mixtures which contain a mixture of tungsten and the same ceramic component as that contained in the green sheet in different mixture ratios. These mixture paste materials are adapted to form the first and second mixture layers 4 and 5, and the mixture paste material for the first mixture layer 4 has higher percentage of the ceramic component as compared with the mixture paste material for the second mixture layer 5. Further, a tungsten paste material containing tungsten is prepared for the tungsten layer 3.

The mixture paste material for the first mixture layer 4 is applied onto the surface of the AlN green sheet and dried. Then, the mixture paste material for the second mixture layer 5 is applied onto the same and dried. Thereafter the tungsten paste material is applied onto the latter mixture paste material and dried.

Then, debinder processing is performed to vaporize binder contained in the AlN green sheet and organic vehicles contained in the two mixture paste materials and the tungsten paste material. Thereafter a firing step is carried out in a non-oxidizing atmosphere at 1850° C. for five hours, thereby to obtain the AlN substrate 1 which is provided with the metallized laminate 2 as shown in FIG. 1.

Although FIG. 1 illustrates two mixture layers 4 and 5, the number of such mixture layers may exceed two. Also in this case, the mixture layer 4 closer to the AlN substrate 1 has a larger content of the ceramic component as compared with the mixture layer 5 closer to the tungsten layer 3.

The following Table shows tensile strength values measured between AlN substrates and tungsten layers fabricated by the aforementioned method. Examples 1, 2, 3 and 4 have two, three, four and five mixture layers with ceramic contents shown in the following Table respectively. In Reference Example 1, no such mixture layer is provided but a tungsten layer is directly formed on an AlN substrate. In Reference Example 2, only a single mixture layer, the ceramic component content of which is shown in the following Table, is formed between an AlN substrate and a tungsten layer.

In order to make tension tests A and B, samples were prepared by providing tungsten layers in the form of circles of 3 mm in diameter on or in relation to AlN substrates and forming nickel films on the tungsten layers by electrolytic plating. In the tension test A, samples were prepared by vertically brazing copper wire members of 2 mm in diameter onto the nickel films of the aforementioned samples with a brazing filler metal of lead-tin alloy. In the tension test B, samples were prepared by vertically brazing copper wire members of 2 mm in diameter onto the nickel films of the aforementioned samples with a brazing filler metal of silver solder and exposing the same to heat cycle conditions. The heat cycle conditions were selected to repeat a cycle of setting the samples under temperatures of 25° C. and 750° C. respectively in a nitrogen gas atmosphere three times. A load was applied to each sample to separate the wire member from the AlN substrate, and gradually increased to obtain the tensile strength value from the load with which the wire member was separated from the AlN substrate. The number n of samples was 20.

TABLE 1

| | Content (wt. %) of Ceramic Component in Mixture Paste | | | | | Tensile Strength ($kg/mm^2$) | |
| --- | --- | --- | --- | --- | --- | --- | --- |
| | 1st Layer | 2nd Layer | 3rd Layer | 4th Layer | 5th Layer | Tension Test A (n = 20) | Tension Test B (n = 20) |
| Example 1 | 67 | 33 | — | — | — | 6.6 | 6.5 |
| Example 2 | 75 | 50 | 25 | — | — | 6.7 | 6.6 |
| Example 3 | 80 | 60 | 40 | 20 | — | 6.8 | 6.7 |
| Example 4 | 83 | 67 | 50 | 33 | 17 | 6.8 | 6.8 |
| Reference Example 1 | — | — | — | — | — | 4.7 | 2.1 |
| Reference Example 2 | 50 | — | — | — | — | 6.2 | 3.2 |

As understood from the above Table, Examples 1, 2, 3 and 4 exhibited relatively high tensile strength values of 6.6 to 6.8 $kg/mm^2$ in the tension test A. Such relatively high tensile strength values were also substantially maintained in the tension test B performed after exposure to the heat cycle conditions. On the other hand, Reference Example 2 provided with only a single mixture layer exhibited a relatively high tensile strength value of 6.2 $kg/mm^2$ in the tension test A, while this value was reduced to 3.2 $kg/mm^2$ in the tension test B after exposure to the heat cycle conditions. Reference Example 1 provided with no mixture layer already exhibited a low tensile strength value of 4.7 $kg/mm^2$ in the tension test A, while this value was further reduced to 2.1 $kg/mm^2$ in the tension test B.

Figure 2:
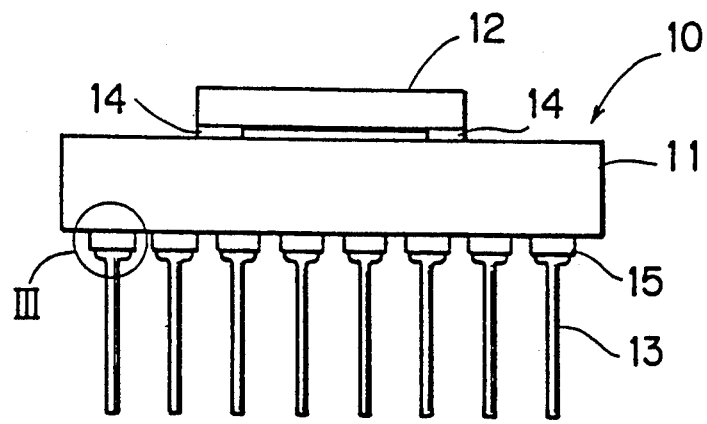
FIG. 2 is a front elevational view showing a pin grid array type IC package to which the present invention is applied.
Figure 3:
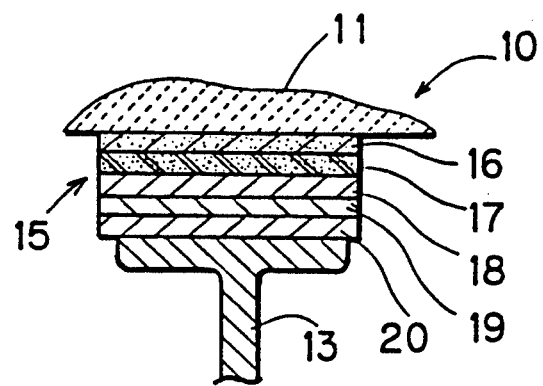
FIG. 3 is a sectional view showing a part III of FIG. 2 in an enlarged manner.

FIGS. 2 and 3 show a pin grid array type IC package 10, to which the present invention is applied. This IC package 10 comprises a multilayer substrate 11 of AlN. An IC 12 is provided above the substrate 11, while a plurality of aligned terminal pins 13 are provided under the substrate 11. Electrical interconnection (not shown) is provided within the substrate 11, so that the IC 12 is electrically connected with the pins 13 through the electrical interconnection. In order to achieve such electrical connection and mechanical fixing of the IC 12 and the terminal pins 13 to the substrate 11, metallized laminates 14 and 15 characterizing the present invention are provided on the substrate 11.

FIG. 3 shows each metallized laminate 15 in detail. This metallized laminate 15 comprises a first mixture layer 16 which is in contact with the AlN multilayer substrate 11, a second mixture layer 17 formed thereon and a tungsten layer 18 formed thereon. Similarly to the aforementioned first and second mixture layers 4 and 5, the first and second mixture layers 16 and 17 contain a mixture of tungsten and the same ceramic component as that contained in the substrate 11. The first mixture layer 16 has a higher content of the ceramic component as compared with the second mixture layer 17. An electrolytic plating layer 19 of nickel, for example, is formed on the tungsten layer 18, and the terminal pin 13 is connected to the electrolytic plating layer 19 by a brazing filler metal 20 such as silver solder or lead-tin alloy, for example.

In such an IC package 10, the AlN multilayer substrate 11 is employed for increasing capacity of dissipating heat generated from the IC 12.

FIGS. 4 to 7 show a ceramic heater 22.

In this ceramic heater 22, a snaking tungsten layer 23 is employed as a heating element. A metallized laminate 24 including the tungsten layer 23 is held between two AlN substrates 25 and 26.

As clearly shown in FIG. 6, the metallized laminate 24 is symmetrical about the tungsten layer 23. Mixture layers 27 and 28 having relatively small contents of ceramic components are formed to be in contact with both surfaces of the tungsten layer 23. Mixture layers 29 and 30 having relatively large contents of ceramic components are formed on the mixture layers 27 and 28 respectively. The mixture layers 29 and 30 are in contact with the AlN substrates 25 and 26 respectively. The mixture layers 27 and 28 correspond to the aforementioned second mixture layer 5, and the mixture layers 29 and 30 correspond to the aforementioned first mixture layer 4.

Lead terminals 31 and 32 of tungsten, for example, are electrically connected to respective end portions of the tungsten layer 23. These lead terminals 31 and 32 are substantially identical in electrical connection structure and mechanical mounting structure to each other. In relation to the lead terminal 32 which is clearly shown in FIG. 7, a terminal electrode 33 is formed on the tungsten layer 23 with an electrolytic plating film of nickel, for example. FIG. 4 shows another terminal electrode 34, which is provided in relation to the lead terminal 31. Referring again to FIG. 7, the lead terminal 32 is connected to the terminal electrode 33 by a brazing filler metal 35 such as silver solder, for example. The connected portion of the lead terminal 32 is sealed by a sealing agent 36 of glass, for example.

According to the ceramic heater 22 of such structure, heating efficiency can be improved due to employment of the AlN substrates 25 and 26. Further, the mixture layers 27 and 29 and the mixture layers 28 and 30 are interposed between the tungsten layer 23 and the AlN substrates 25 and 26 respectively, thereby to prevent separation caused between the metallized laminate 24 and the AlN substrates 25 and 26 and to improve reliability against repetition of heating and cooling.

Figure 8:
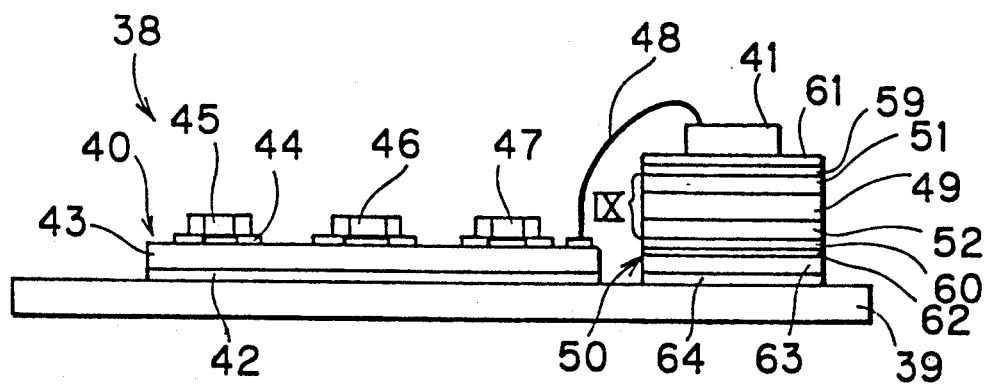
FIG. 8 is a front elevational view showing a power unit to which the present invention is applied.
Figure 9:
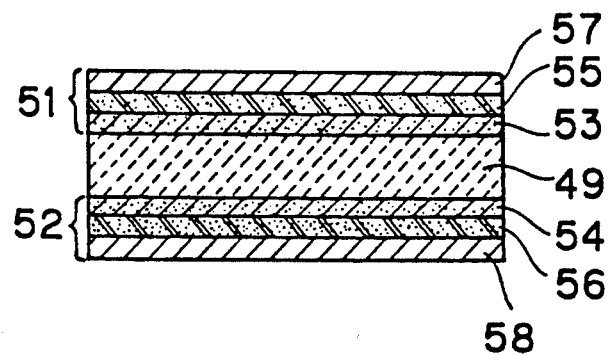
FIG. 9 is an enlarged sectional view showing a part IX of FIG. 8.

FIGS. 8 and 9 show a power unit 38 which is employed in relation to the engine of an automobile, for example.

The power unit 38 comprises a hybrid IC 40 and a power diode 41 which are carried on an aluminum plate 39. The hybrid IC 40 comprises an alumina substrate 43 which is mounted on the aluminum plate 39 through an adhesive agent 42. Appropriate interconnection patterns 44 are formed on the alumina substrate 43, and various components 45, 46 and 47 are mounted in relation to the interconnection patterns 44. FIG. 8 further shows a wire member 48 which electrically connects the hybrid IC 40 with the power diode 41.

A mount 50 comprising an AlN substrate 49 is employed in order to improve efficiency of heat dissipation from the power diode 41 in the power unit 38. In this mount 50, metallized laminates 51 and 52 are formed on upper and lower surfaces of the AlN substrate 49 respectively. FIG. 9 is an enlarged sectional view showing only the AlN substrate 49 and metallized laminates 51 and 52. The metallized laminates 51 and 52 comprise first mixture layers 53 and 54, second mixture layers 55 and 56 and tungsten layers 57 and 58 respectively. The first mixture layers 53 and 54 correspond to the aforementioned first mixture layer 4, and the second mixture layers 55 and 56 correspond to the aforementioned second mixture layer 5.

Referring again to FIG. 8, electrolytic plating films 59 and 60 of nickel, for example, are formed on the metallized laminates 51 and 52 respectively. The power diode 41 is connected onto the upper electrolytic plating film 59 through a brazing filler metal 61 of lead-tin alloy, for example. On the other hand, a copper plate 63 is joined onto the lower electrolytic plating film 60 through a brazing filler metal 62 such as silver solder or lead-tin alloy, for example. The copper plate 63 is joined to the aluminum plate 39 through a brazing filler metal 64 such as silver solder or lead-tin alloy, for example.

According to the aforementioned fabrication method, the tungsten layer and the mixture layers are fired simultaneously with sintering of the AlN substrate in order to obtain the inventive structure metallized with tungsten on the aluminum nitride substrate. However, the AlN substrate may be previously sintered to thereafter fire the tungsten layer and the mixture layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A metallized ceramic structure comprising:
 a ceramic substrate consisting essentially of aluminum nitride;
 a metallic layer consisting essentially of tungsten bonded to said ceramic substrate; and
 first and second mixture layers formed between said ceramic substrate and said metallic layer to bond said ceramic substrate and said metallic layer, said first mixture layer being in contact with said ceramic substrate and said second mixture layer being in contact with said metallic layer, each of said mixture layers including a mixture of said ceramic of said ceramic substrate and said metal of said metallic layer, with said second mixture layer having a lower percentage of said ceramic than said first mixture layer, said first mixture layer including approximately 67-83% by weight of aluminum nitride and 17-33% by weight of tungsten.

2. The metallized ceramic structure of claim 1 wherein said metallic layer includes a metallic paste material applied to said second mixture layer.

3. The metallized ceramic structure of claim 1 further comprising an electrolyte plating film formed on said metallic layer.

4. The metallized ceramic structure of claim 1 further comprising a conductive member brazed onto said electrolyte plating film.

5. The metallized ceramic structure of claim 4 wherein said conductive member includes a terminal member.

6. The metallized ceramic structure of claim 3 further comprising a power diode brazed onto said electrolyte plating film.

7. The metallized ceramic structure of claim 1 wherein said ceramic substrate includes first and second opposite surfaces, each surface having a respective metallic layer bonded thereto.

8. The metallized ceramic structure of claim 1 wherein said metallic layer includes first and second opposite surfaces, each surface having a respective ceramic substrate bonded thereto.

9. The metallized ceramic structure of claim 1, wherein said second mixture layer includes approximately 17-33% by weight of aluminum nitride and 67-83% by weight of tungsten.

10. An integrated circuit package comprising:
a ceramic substrate consisting essentially of aluminum nitride including first and second opposite surfaces;
a first metallic layer consisting essentially of tungsten bonded to said first surface;
a second metallic layer consisting essentially of tungsten bonded to said second surface;
a first mixture layer and a second mixture layer formed between said first and second metallic layers and said respective first and second surfaces of said ceramic substrate to bond said first and second surfaces of said ceramic substrate and said respective first and second metallic layers, said first mixture layers being in contact with said first and second surfaces of said ceramic substrate and said second mixture layers being in contact with said first and second metallic layers, each of said mixture layers including a mixture of said ceramic of said respective ceramic substrate and said metal of said respective metallic layer, with said second mixture layer having a lower percentage of said ceramic than said first mixture layer, said first mixture layer including approximately 67-83% by weight of aluminum nitride and 17-33% by weight of tungsten;
first and second electrolyte plating films formed on said respective first and second metallic layers;
an integrated circuit brazed to said first electrolyte plating film; and
a terminal pin electrically connected to said integrated circuit and brazed to said second electrolyte plating film.

11. The integrated package of claim 10, wherein said second mixture layer includes approximately 17-33% by weight of aluminum nitride and 67-83% by weight of tungsten.

12. A ceramic heater comprising:
a ceramic substrate consisting essentially of aluminum nitride;
a metallic heating element consisting essentially of tungsten bonded to said ceramic substrate;
first and second mixture layers formed between said ceramic substrate and said metallic heating element to bond said ceramic substrate and said metallic heating element, said first mixture layer being in contact with said ceramic substrate, and said second mixture layer being in contact with said metallic heating element, each of said mixture layers including a mixture of said ceramic of said ceramic substrate and said metal of said metallic heating element, with said second mixture layer having a lower percentage of said ceramic than said first mixture layer, said first mixture layer including approximately 67-83% by weight of aluminum nitride and 17-33% by weight of tungsten;
a terminal electrode including an electrolyte plating film formed on said metallic heating element; and
a lead terminal brazed onto said terminal electrode.

13. The ceramic heater of claim 12, wherein said second mixture layer includes approximately 17-33% by weight of aluminum nitride and 67-83% by weight of tungsten.

14. A metallized ceramic structure comprising:
a ceramic substrate consisting essentially of aluminum nitride;
a metallic layer consisting essentially of tungsten bonded to said ceramic substrate;
first and second mixture layers formed between said ceramic substrate and said metallic layer to bond said ceramic substrate and said metallic layer, said first mixture layer being in contact with said ceramic substrate and said second mixture layer being in contact with said ceramic substrate and said second mixture layer being in contact with said metallic layer, each of said mixture layers including a mixture of said ceramic of said ceramic substrate and said metal of said metallic layer, with said second mixture layer having a lower percentage of said ceramic than said first mixture layer, said first mixture layer including approximately 67-83% by weight of aluminum nitride and 17-33% by weight of tungsten;
said metallic layer being bonded to said ceramic substrate by a method comprising the steps of:
mixing first and second compositions of material, each composition including a mixture of said ceramic of said ceramic substrate and said metal of said metallic layer, said second composition having a lower percentage of said ceramic than said first composition;
applying said first composition to the surface of said ceramic substrate to form said first mixture layer of material;
drying said first mixture layer;
applying said second composition to said first composition to form said second mixture layer of material;
drying said second layer;
forming said metallic layer on said second mixture layer; and
firing said mixture layers and said ceramic substrate.

15. The metallized ceramic structure of claim 14, wherein said second mixture layer includes approximately 17-33% by weight of aluminum nitride and 67-83% by weight of tungsten.

* * * * *